(12) United States Patent
Kido et al.

(10) Patent No.: US 8,093,635 B2
(45) Date of Patent: Jan. 10, 2012

(54) SOLID-STATE IMAGING ELEMENT

(75) Inventors: Hideo Kido, Kanagawa (JP); Kazuichiro Itonaga, Tokyo (JP); Kai Yoshitsugu, Nagasaki (JP); Kenichi Chiba, Nagasaki (JP)

(73) Assignee: Sony Corporation, Tokyo (JP)

( * ) Notice: Subject to any disclaimer, the term of this patent is extended or adjusted under 35 U.S.C. 154(b) by 429 days.

(21) Appl. No.: 12/076,792

(22) Filed: Mar. 24, 2008

(65) Prior Publication Data

US 2008/0237666 A1 Oct. 2, 2008

(30) Foreign Application Priority Data

Mar. 30, 2007 (JP) .................................. 2007-094755

(51) Int. Cl.
*H01L 31/113* (2006.01)
(52) U.S. Cl. .................... 257/292; 257/E27.133; 257/72
(58) Field of Classification Search .................. 257/72, 257/290, 291, 292, 293, 294, E27.113, E27.133
See application file for complete search history.

(56) References Cited

U.S. PATENT DOCUMENTS

| | | | | |
|---|---|---|---|---|
| 6,160,282 | A * | 12/2000 | Merrill | 257/292 |
| 6,835,590 | B2 * | 12/2004 | Lee | 438/69 |
| 7,358,552 | B2 * | 4/2008 | Lee | 257/292 |
| 2004/0232494 | A1 * | 11/2004 | Nagano et al. | 257/382 |
| 2006/0275945 | A1 * | 12/2006 | Yang et al. | 438/73 |
| 2007/0023802 | A1 * | 2/2007 | Oh et al. | 257/292 |
| 2007/0072325 | A1 * | 3/2007 | Rhodes | 438/48 |
| 2007/0102738 | A1 * | 5/2007 | Adkisson et al. | 257/292 |
| 2008/0020588 | A1 * | 1/2008 | Hung et al. | 438/758 |
| 2008/0157144 | A1 * | 7/2008 | Lee | 257/292 |

FOREIGN PATENT DOCUMENTS

| JP | 2004-127957 | 4/2004 |
|---|---|---|
| JP | 2005-174968 | 6/2005 |

OTHER PUBLICATIONS

Michael Quirk el al., Semiconductor Manufacturing Technology, 2001, Prentice Hall, ISBN 0-13-081520-9, pp. 260-262.*

* cited by examiner

*Primary Examiner* — Jerome Jackson, Jr.
*Assistant Examiner* — Paul Budd
(74) *Attorney, Agent, or Firm* — Rader, Fishman & Grauer PLLC

(57) ABSTRACT

There is provided a solid-state imaging element having a light receiving part generating charges by light irradiation, and a source/drain region of a transistor, both formed in a semiconductor layer. The solid-state imaging element includes a non-silicided region including the light receiving part, in which surfaces of the source/drain region and a gate electrode of the transistor are not silicided; and a silicided region in which the surfaces of the source/drain region and the gate electrode of the transistor are silicided. The non-silicided region has a sidewall formed on a side surface of the gate electrode of the transistor, a hydrogen supply film formed to cover the semiconductor layer, the gate electrode, and the sidewall, and a salicide block film formed on the hydrogen supply film to prevent silicidation. The silicided region has a sidewall formed on the side surface of the gate electrode of the transistor.

5 Claims, 8 Drawing Sheets

SOLID-STATE IMAGING ELEMENT

CROSS REFERENCES TO RELATED APPLICATIONS

The present invention contains subject matter related to Japanese Patent Application JP 2007-094755 filed in the Japanese Patent Office on Mar. 30, 2007, the entire contents of which are incorporated herein by reference.

BACKGROUND OF THE INVENTION

1. Field of the Invention

The invention relates to a solid-state imaging element and a method for producing a solid-state imaging element. More particularly, the invention relates to a solid-state imaging element having a high-melting metal silicide formed in a CMOS circuit region without a high-melting metal silicide formed in a pixel region and a method for producing the same.

2. Description of the Related Art

A CMOS solid-state imaging element has a pixel region generating charges by light irradiation (photodiode) and a transistor to read the charges generated in the light receiving region as signals (MOS transistor), both formed on a common substrate.

A non-silicided transistor is used as a CMOS transistor in a pixel, and a silicided transistor is used as a MOS transistor in a peripheral circuit.

The silicided MOS transistor has a high-melting metal silicide layer formed on a surface of a polysilicon gate electrode and a surface of a source/drain region.

The non-silicided MOS transistor has a salicide block film formed by a silicon nitride film to prevent silicidation of the transistor.

Since a source/drain injection step is carried out after the salicide block film formation step, the source/drain injection step for the silicided transistor differs from that for the non-silicided transistor (see Japanese Unexamined Patent Application Publication No. 2004-127957 and Japanese Unexamined Patent Application Publication No. 2005-174968, for example).

A method for producing a CMOS solid-state imaging element of the related art will be described with reference to FIGS. 1 to 3.

In FIGS. 1 to 3, only one gate electrode among a plurality of electrodes in a transistor formed in a pixel region and one gate electrode among a plurality of electrodes in a transistor formed in a logic circuit region are described as examples with reference to cross-sectional views, respectively.

First, a gate electrode 61 of a pixel transistor Tr is formed by a polysilicon film on a pixel region 60 of a semiconductor layer 200 through a gate insulating film 62. Then, a gate electrode 71 of a circuit transistor Tr is formed by a polysilicon film on a logic circuit region 70 through a gate insulating film 72.

Then, as shown in FIG. 1A, n-type impurities, phosphorus (P) ions for example, are injected into the semiconductor layer 200 using the gate electrodes 61 and 71 as masks to form $n^-$ regions 65 and 75, having an LDD structure in the semiconductor layer 200.

Next, an HTO (High Temperature Oxide) film 50 is formed by silicon oxide in each of the logic circuit region 70 and the pixel region 60, and a salicide block film as a SiN film (LP-SiN film) 51 formed by low pressure CVD is further deposited on the HTO film 50 as a silicon nitride film. Then, as shown in FIG. 1B, the LP-SiN film 51 in the pixel region 60 is covered with a photoresist 63.

Next, after covering the LP-SiN film 51 in the pixel region 60 with the photoresist 63, the salicide block film in the logic circuit region 70 is etched back. Accordingly, as shown in FIG. 1C, a sidewall 52 is formed by the HTO film 50 and the LP-SiN film 51 on a side surface of the gate electrode 71.

Next, as shown in FIG. 2D, the photoresist 63 is removed, and then a whole surface of each of the pixel region 60 and the logic circuit region 70 is covered with an HTO film 53. Then, the HTO film 53 is etched back.

Accordingly, as shown in FIG. 2E, a salicide block film 54 is formed by three layers of the HTO film 50, the LP-SiN film 51, and the HTO film 53 on the side surface of the gate electrode 71 of the logic circuit region 70.

In the pixel region 60, a salicide block film 55 is formed by the HTO film 50, the LP-SiN film 51, and the HTO film 53, with the HTO film 50 and the LP-SiN film 51 remaining on the whole surface of the pixel region 60.

Then, as shown in FIG. 2F, the pixel region 60 is covered with a photoresist 64, and then n-type impurities, phosphorus (P) ions for example, are injected using the salicide block film 54 in the logic circuit region 70 as a mask to form an n-type high impurity concentration region ($n^+$ region) 76 in the semiconductor layer 200.

Here, n-type impurities are not injected into the pixel region 60 due to the presence of the photoresist 64.

The photoresist 64 is removed after this step.

Next, as shown in FIG. 3G, the logic circuit region 70 is covered with a photoresist 73, and then n-type impurities, for example, phosphorus (P) ions, are injected using the HTO film 53 in the pixel region 60 as a mask to form an n-type high impurity concentration region ($n^+$ region) 66 in the semiconductor layer 200. In the ion injection shown in FIG. 3G, n-type impurities are injected into the pixel region 60 through the HTO film 50 and the LP-SiN film 51. Therefore, it may be necessary to make implantation energy for ion injection into the pixel region 60 higher than implantation energy in forming the $n^+$ region 76 in the logic circuit region 70.

Here, n-type impurities are not injected into the logic circuit region 70 due to the presence of the photoresist 73.

Next, as shown in FIG. 3H, the photoresist 73 is removed, and then a high-melting metal film 56 is formed on the whole surface of each of the pixel region 60 and the logic circuit region 70.

Next, silicon is reacted with the high-melting metal to form high-melting metal silicide layers 77 and 78 on a surface of the gate electrode 71 and a surface of the $n^+$ region 76 in the logic circuit region 70, respectively.

Next, as shown in FIG. 3I, an excess of the high-melting metal film 56 is removed to form the non-silicided pixel region 60 and the silicided logic circuit region 70.

SUMMARY OF THE INVENTION

However, when the non-silicided pixel region 60 and the silicided logic circuit region 70 are formed as in the above steps, it may be necessary to perform ion injection in different steps, resulting in an increase in the number of steps.

In the above steps, the source/drain injection step is performed after depositing the HTO film 50 and the LP-SiN film 51 in the pixel region 60.

Therefore, source/drain injection is performed through the HTO film 50 and the LP-SiN film 51, and uniform injection may not be performed.

Further, in the above steps, the LP-SiN film 51 is deposited and then the HTO film 53 is deposited and etched back to form the salicide block film 54. However, in this case, when the HTO film 53 is etched back, the LP-SiN film 51 is damaged to cause defects in the LP-SiN film 51 and the HTO film 50 under the LP-SiN film 51. Accordingly, the non-silicided region is silicided in defective parts disadvantageously.

In the pixel region 60, having the configuration shown in FIG. 3I, the LP-SiN film 51 is used as a nitride film of the salicide block film. However, since hydrogen supply is prevented in the LP-SiN 51, it may be impossible to passivate dangling bond defects by supplying hydrogen and reduce an effect of the defects in the light receiving region of the solid-state imaging element.

Accordingly, as shown in FIG. 4, the LP-SiN film 51 and the HTO film 50 are partially removed in a light receiving region 57 to form an opening, and the pixel region 60 is covered with a silicon nitride film (UV-SiN film) 58 deposited by plasma CVD using an ultraviolet light source having the hydrogen supply ability.

However, it may be necessary to provide a step of partially removing the LP-SiN film 51 and the HTO film 50 to form an opening and a step of depositing the UV-SiN film 58 separately from the above steps, resulting in an increase in the number of steps.

If the UV-SiN film is used as a salicide block film, it has inferior process ability, and thus cannot be used as a salicide block film.

When a diffused resistor 59 against electrostatic breakdown is formed in an I/O cell in the logic circuit region 70 as shown in FIG. 5, the HTO film 50 and the LP-SiN film 51 physically prevent injection of impurity ions in the above steps.

In the I/O cell having such a configuration, it may be necessary to form a salicide block film on a surface of the diffused resistor 59, suppressing voltage applied to a transistor gate in order to prevent silicidation. It may be necessary be inject ions through the HTO film 50 and the LP-SiN film 51, making it difficult to perform uniform injection.

Therefore, a variation as a resistive element occurs in the formed diffused resistor 59.

Embodiments of the invention have attempted to provide a solid-state imaging element and a method for producing the same, where the solid-state imaging element has a configuration in which the ability of a salicide block film is not reduced by etch back treatment, hydrogen may be supplied without opening the salicide block film, and ions may be uniformly injected.

According to an embodiment of the invention, there is provided a solid-state imaging element having a light receiving part generating charges by light irradiation and a source/drain region of a transistor, both formed in a semiconductor layer. The solid-state imaging element includes a non-silicided region including the light receiving part, in which surfaces of the source/drain region and a gate electrode of the transistor are not silicided, and a silicided region in which the surfaces of the source/drain region and the gate electrode of the transistor are at least silicided. The non-silicided region has: a sidewall formed on a side surface of the gate electrode of the transistor; a hydrogen supply film formed to cover the semiconductor layer, the gate electrode, and the sidewall; and a salicide block film formed on the hydrogen supply film to prevent silicidation. The silicided region has a sidewall formed on the side surface of the gate electrode of the transistor without covering the semiconductor layer, the gate electrode, and the sidewall of the transistor in the non-silicided region by the hydrogen supply film and the salicide block film formed on the hydrogen supply film.

According to an embodiment of the invention, there is provided a method for producing a solid-state imaging element having: a silicided region in which surfaces of a source/drain region and a gate electrode of a transistor are at least silicided; and a non-silicided region in which the surfaces of the source/drain region and the gate electrode of the transistor are not silicided. The method includes the steps of: forming a gate electrode on a semiconductor layer; forming an insulating film to cover the semiconductor layer and the gate electrode; etching the insulating film to form a sidewall on a side surface of the gate electrode; forming a source/drain region in the semiconductor layer using the gate electrode and the sidewall as masks; forming a hydrogen supply film to cover the gate electrode, the sidewall, the source/drain region, and a light receiving region formed in the semiconductor layer to generate charges by light irradiation; forming a salicide block film on the hydrogen supply film; removing the hydrogen supply film and the salicide block film except for the non-silicided region; and forming a metal silicide film by forming a metal film on a substrate and then thermally treating the metal film to silicide an upper part of the gate electrode and an upper part of the source/drain region in the silicided region based on the reaction of the metal film with silicon.

A solid-state imaging element according to an embodiment of the invention has a non-silicided region having a salicide block film formed on a hydrogen supply film and a silicided region without covering the semiconductor layer, the gate electrode, and the sidewall of the transistor in the non-silicided region by a hydrogen supply film and a salicide block film formed on the hydrogen supply film.

The hydrogen supply film is formed on a semiconductor layer in the non-silicided region, so that hydrogen may be supplied to a light receiving region of the semiconductor layer from an interface of the hydrogen supply film. Therefore, in the production of the solid-state imaging element, dangling bond defects may be passivated by hydrogen supply and an effect of the defects, such as increased white spots, may be reduced in the light receiving region of the semiconductor layer.

The salicide block film is formed on the hydrogen supply film, making it possible to prevent silicidation of the non-silicided region stably.

A method for producing a solid-state imaging element according to an embodiment of the invention includes the steps of etching an insulating film to form a sidewall and subsequently forming a source/drain region, that is, injecting ions, for example, using a gate electrode and the sidewall as masks. Therefore, ions do not have to be injected through the insulating film, and ions may be directly injected into a semiconductor layer.

Accordingly, a variation in ion injection may be reduced, and the source/drain region may be formed uniformly.

Further, after the formation of the source/drain region, a hydrogen supply film is deposited on the semiconductor layer, and then a salicide block film is deposited on the hydrogen supply film.

Therefore, hydrogen may be supplied to dangling bonds in a light receiving region of the semiconductor layer from the hydrogen supply film, and the dangling bonds may be passivated by hydrogen from the hydrogen supply film without forming an opening in a salicide block film in the light receiving region.

Treatment, such as etch back treatment, is not performed in a step after forming the salicide block film. Accordingly, defects in the salicide block film are prevented, and the ability of the salicide block film is not reduced.

According to an embodiment of the invention, ions may be directly injected into a semiconductor layer, and not through a nitride film, to form a uniform source/drain region. Dangling bonds may be passivated by hydrogen supply to reduce defects immediately above a pixel. Further, defects in a salicide block film may be prevented to perform a salicide formation step stably.

DESCRIPTION OF THE PREFERRED EMBODIMENTS

Embodiments of the invention will now be described with reference to the drawings.

Figure 6:
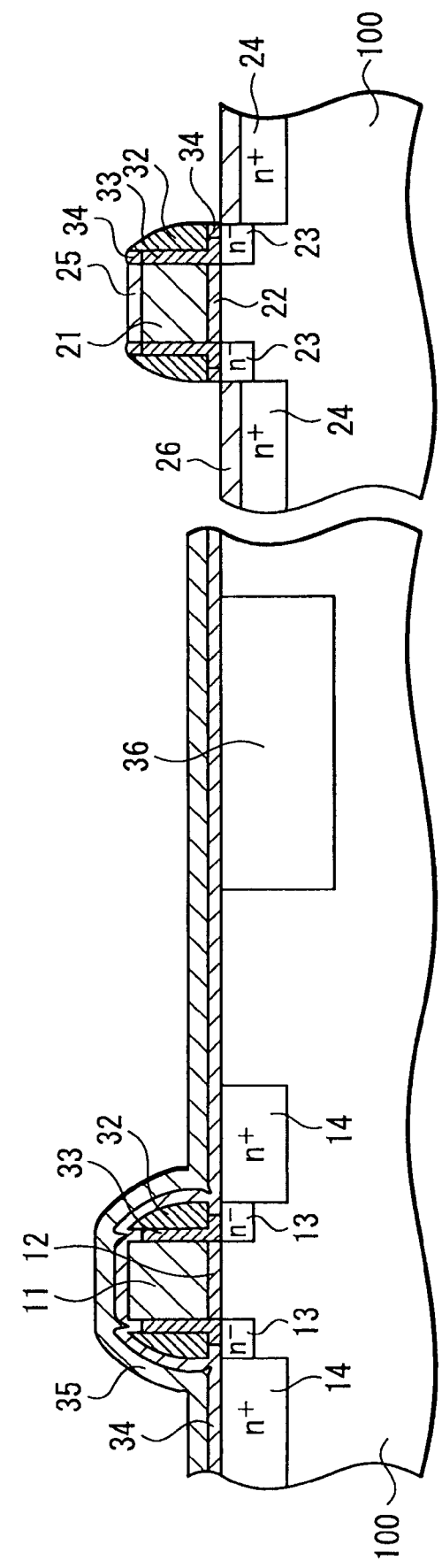
FIG. 6 is a view describing a solid-state imaging element according to an embodiment of the invention.

FIG. 6 is a schematic cross-sectional view showing a solid-state imaging element according to an embodiment of the invention.

The solid-state imaging element shown in FIG. 6 has a pixel region 10 and a logic circuit region 20 formed in a semiconductor layer 100.

In FIG. 6, one gate electrode among a plurality of electrodes in a transistor formed in the pixel region 10 and one gate electrode among a plurality of electrodes in a transistor formed in the logic circuit region 20 are described as examples, respectively. However, the number of transistors formed in each of the pixel region 10 and the logic circuit region 20 is not particularly limited, and two or more transistors may be formed in each of the pixel region 10 and the logic circuit region 20 as necessary.

In the pixel region 10, a gate electrode 11 is formed by polysilicon or the like on the semiconductor layer 100 through a gate insulating film 12.

An n-type low impurity concentration region ($n^-$ region) 13 is formed in the semiconductor layer 100 around the gate electrode 11. Further, an n-type high impurity concentration region ($n^+$ region) 14 is formed around the $n^-$ region 13 to form source/drain regions having an LDD structure.

A light receiving region 36 is formed by a photodiode in the semiconductor layer 100.

A two-layer sidewall is formed on a side surface of the gate electrode 11 by a sidewall 33 formed by a HTO (High Temperature Oxide) film and a sidewall 32 formed by a SiN (LP-SiN) film by low pressure CVD on the sidewall 33.

A silicon nitride film (UV-SiN film) 34 deposited by plasma CVD using an ultraviolet light source is formed as a hydrogen supply film to cover the gate electrode 11, the source/drain regions 13 and 14, the sidewalls 32 and 33, the light receiving region 36, and the semiconductor layer 100. Further, a LP-SiN film 35 is formed as a salicide block film on the UV-SiN film 34.

The UV-SiN film 34 formed as a hydrogen supply film to cover the light receiving region 36 supplies hydrogen to dangling bonds in the light receiving region 36. Therefore, the dangling bonds may be passivated by supplying hydrogen to the light receiving region 36 from the UV-SiN film 34.

The salicide block film is formed by the LP-SiN film 35 to cover a whole surface of a region including the pixel region 10 in which a high-melting metal silicide layer is not formed (non-silicided region). The salicide block film may prevent formation of a high-melting metal silicide layer in the non-silicided region.

On the other hand, in the logic circuit region 20, a gate electrode 21 is formed by polysilicon or the like on the semiconductor layer 100 through a gate insulating film 22.

A n-type low impurity concentration region ($n^-$ region) 23 is formed in the semiconductor layer 100 around the gate electrode 21. Further, a n-type high impurity concentration region ($n^+$ region) 24 is formed around the $n^-$ region 23 to form source/drain regions having a LDD structure.

A two-layer sidewall is formed on a side surface of the gate electrode 21 by a sidewall 33 formed by an HTO (High Temperature Oxide) film and a sidewall 32 formed by a SiN (LP-SiN) film by low pressure CVD on the sidewall 33. UV-SiN films 34 are formed under the sidewall 32 and in an offset part provided on an edge of the sidewall 33 between the sidewall 32 and the gate electrode 21, respectively.

Silicided regions are formed by high-melting metal silicide layers 25 and 26 of a high-melting metal, such as cobalt, on a surface of the gate electrode 21 and a surface of the $n^+$ region 24 in the source/drain regions, respectively.

As described above, the solid-state imaging element is formed by a non-silicided region having a salicide block film formed on a hydrogen supply film and a silicided region without covering the semiconductor layer, the gate electrode, and the sidewall of the transistor in the non-silicided region by a hydrogen supply film and a salicide block film formed on a hydrogen supply film.

The UV-SiN film 34 is formed as a hydrogen supply film on the light receiving region 36 in the pixel region 10 in the non-silicided region. Therefore, in the solid-state imaging element, dangling bond defects may be passivated by hydrogen supply and an effect of the defects, such increased white spots, may be reduced in the light receiving region 36 of the semiconductor layer 100.

Further, in the non-silicided region, a salicide block film is formed by the LP-SiN film 35 on the hydrogen supply film formed by the UV-SiN film 34.

A UV-SiN film has low ability as a salicide block film. Therefore, a non-silicided region may be silicided when the UV-SiN film is used as a salicide block film. On the contrary, a LP-SiN film has high ability as a salicide block film and therefore may stably prevent silicidation of a non-silicided region.

In each of the pixel region 10 in the non-silicided region and the logic circuit region 20 in the silicided region, a sidewall having an identical structure is formed by two layers of the HTO film 33 and the LP-SiN film 32. Therefore, source/drain regions having a common device structure are formed in the pixel region 10 and the logic circuit region 20 by providing common transistor device parameters.

A method for producing the solid-state imaging element according to the aforementioned embodiment will be described with reference to FIGS. 7 to 9.

In FIGS. 7 to 9, only one gate electrode among a plurality of electrodes in a transistor formed in a pixel region and one gate electrode among a plurality of electrodes in a transistor formed in a logic circuit region are described as examples with reference to cross-sectional views, respectively.

First, a gate electrode 11 of a pixel transistor Tr is formed by a polysilicon film on a pixel region 10 of a semiconductor layer 100 through a gate insulating film 12. Then, a gate electrode 21 of a circuit transistor Tr is formed by a polysilicon film on a logic circuit region 20 of the semiconductor layer 100 through a gate insulating film 22.

Then, n-type impurities, for example, phosphorus (P) ions, are injected into the semiconductor layer 100 using the gate electrodes 11 and 21 as masks to form $n^-$ regions 13 and 23 having an LDD structure in the pixel region 10 and the logic circuit region 20, respectively.

Figure 7A:
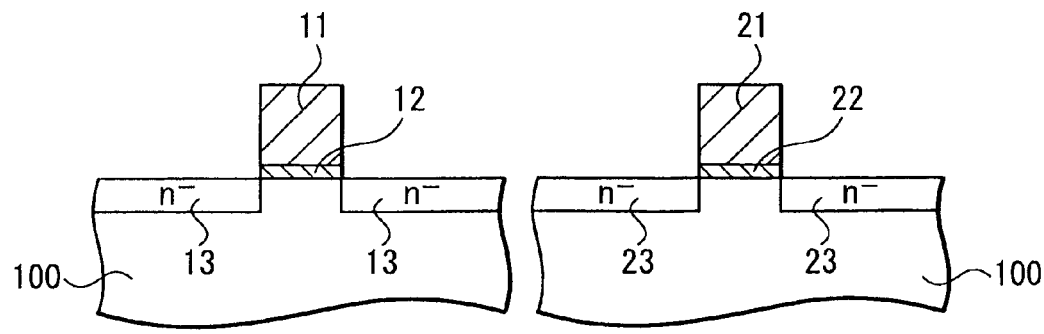
FIGS. 7A to 7C are views describing a method for producing a solid-state imaging element according to an embodiment of the invention.

Accordingly, as shown in FIG. 7A, the gate insulating film 12, the gate electrode 11, and the $n^-$ regions 13 are formed in the pixel region 10 of the semiconductor layer 100, and the gate insulating film 22, the gate electrode 21, and the $n^-$ regions 23 are formed in the logic circuit region 20.

$p^-$ regions having an LDD structure (not shown) are selectively formed in p-channel MOS transistor formation regions of a CMOS logic circuit.

Figure 7B:
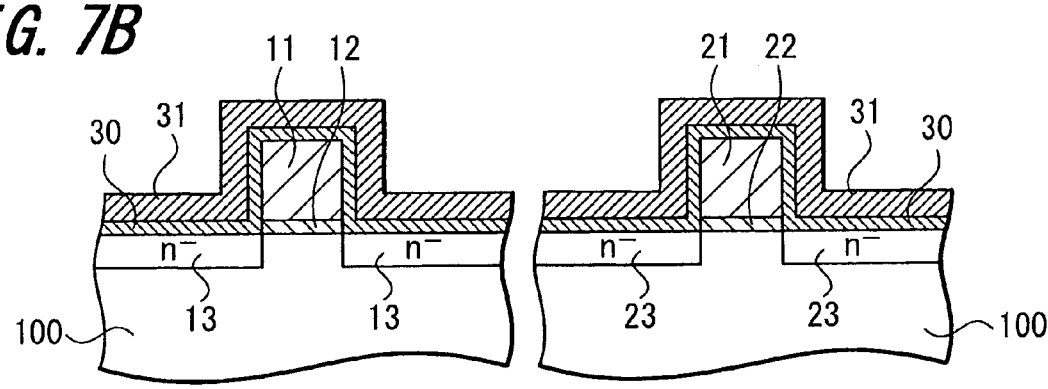

Next, as shown in FIG. 7B, an HTO film 30 is deposited as a silicon oxide film on a whole surface of each of the pixel region 10 and the logic circuit region 20, and a LP-SiN film 31 is deposited as a silicon nitride film on the HTO film 30.

Figure 7C:
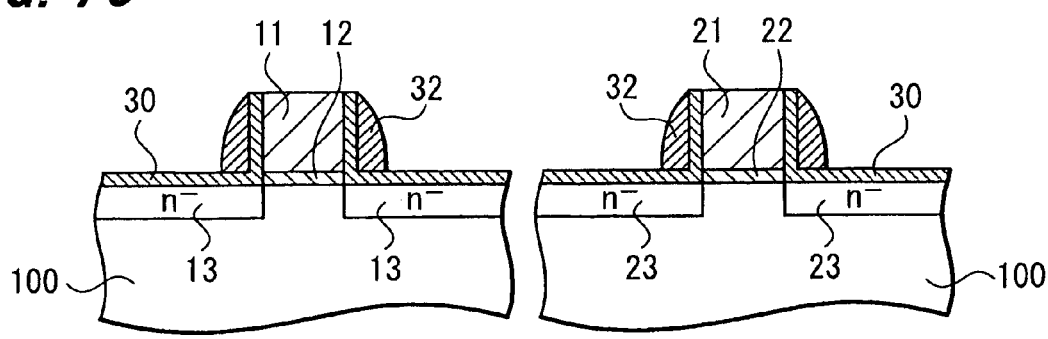

Next, as shown in FIG. 7C, the LP-SiN film 31 formed in each of the pixel region 10 and the logic circuit region 20 is etched back by anisotropic etching to form a sidewall 32 of the LP-SiN film 31. Here, the LP-SiN film 31 may be etched back by highly selective etching, such as RIE (Reactive Ion Etching), between the HTO film 30 and the LP-SiN film 31.

Figure 8D:
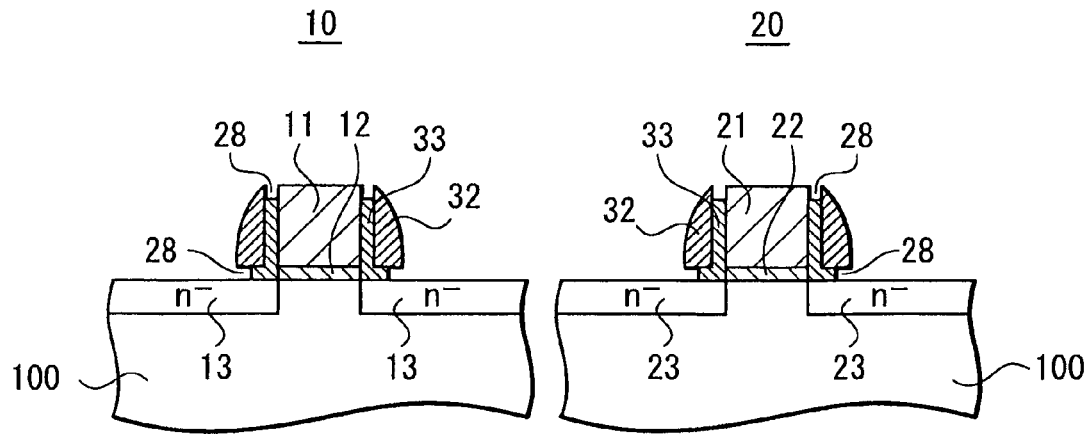
FIGS. 8D to 8F are views describing a method for producing a solid-state imaging element according to an embodiment of the invention.

Next, the HTO film 30 formed in each of the pixel region 10 and the logic circuit region 20 is removed by wet etching. Accordingly, as shown in FIG. 8D, a sidewall 33 may be formed between the gate electrode 11 or 21 and the $n^-$ region 13 or 23 and the sidewall 32.

In wet etching of the HTO film, damage to a surface of the semiconductor layer 100 may be reduced by use of dilute hydrofluoric acid.

In the aforementioned wet etching, the HTO film 30 is etched in not only a part exposed on the surface of the semiconductor layer 100 but also an edge of the HTO film 30 formed under the sidewall 32 of LP-SiN and an edge of the HTO film 30 formed between the sidewall 32 and the gate electrode 21.

Accordingly, an edge of the sidewall 33 exposed between the gate electrode 21 and the sidewall 32 and an edge of the sidewall 33 exposed between the $n^-$ region 23 and the sidewall 32 are etched to form offset parts 28.

Figure 8E:
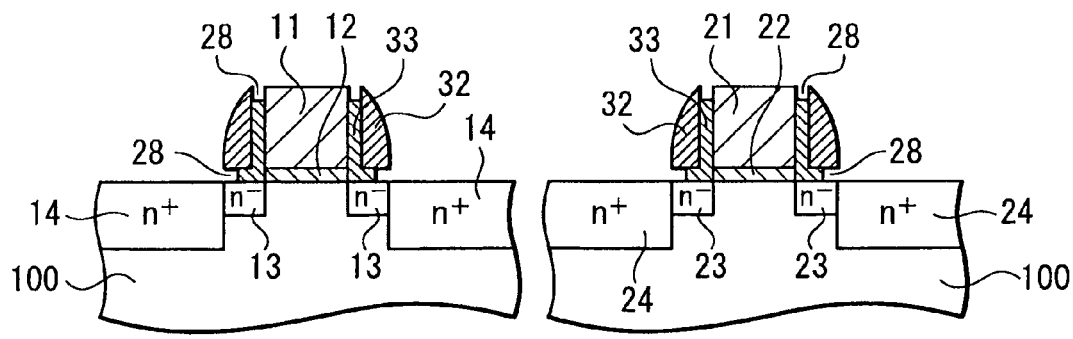

Next, as shown in FIG. 8E, n-type impurities, for example, phosphorus (P) ions, are injected into the semiconductor layer 100 using the gate electrodes 11 and 21 and the sidewalls 32 and 33 as masks to form n-type high impurity concentration regions ($n^+$ regions) 14 and 24 in the semiconductor layer 100.

Accordingly, n-type source/drain regions having an LDD structure of an n-channel MOS transistor may be formed by the $n^+$ regions 24 and the $n^-$ regions 23 in the semiconductor layer 100.

High concentration p-type impurity ions are selectively injected into p-channel MOS formation regions, so that p-type source/drain regions having an LDD structure (not shown) are formed by $p^+$ regions and $p^-$ regions.

Here, the gate electrodes 11 and 21 are identical in shape and the sidewalls 32 and 33 are identical in shape in the pixel region 10 and the logic circuit region 20 to provide common transistor device parameters. Accordingly, source/drain injection may be simultaneously performed in the pixel region 10 and the logic circuit region 20.

In the method according to the present embodiment, source/drain injection may be simultaneously performed in the pixel region 10 and the logic circuit region 20 in an identical step as described above, and therefore the number of steps may be reduced.

Further, since source/drain injection in the pixel region 10 is not performed through a film, such as the HTO film 30 or the LP-SiN film 31, a variation in source/drain region may be reduced.

Figure 1A:
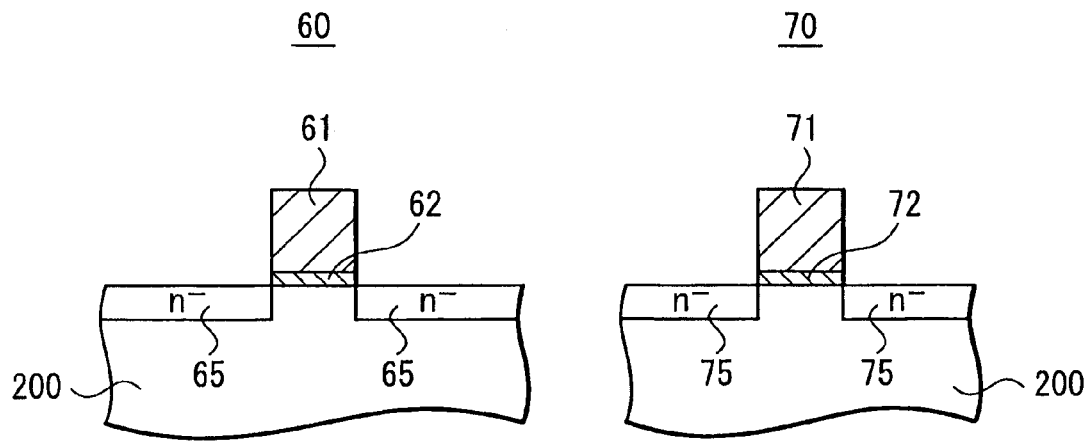
FIGS. 1A to 1C are views describing a method for producing a solid-state imaging element of the related art.
Figure 1B:
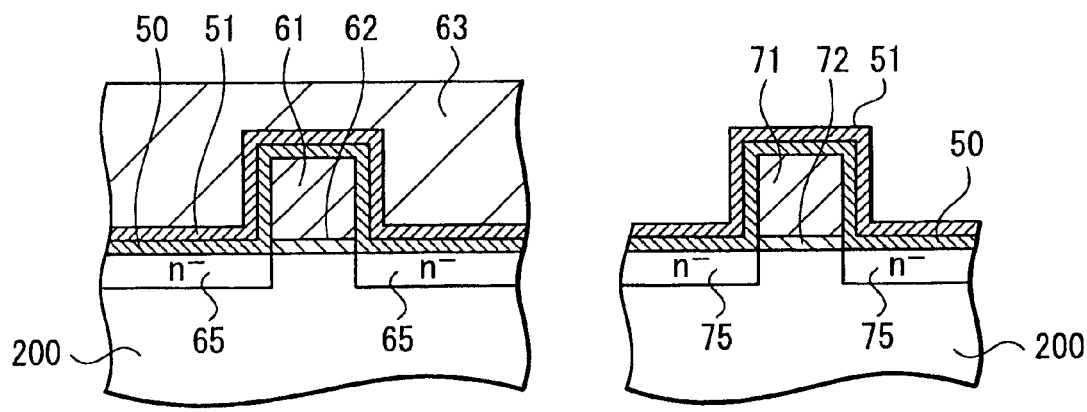
Figure 1C:
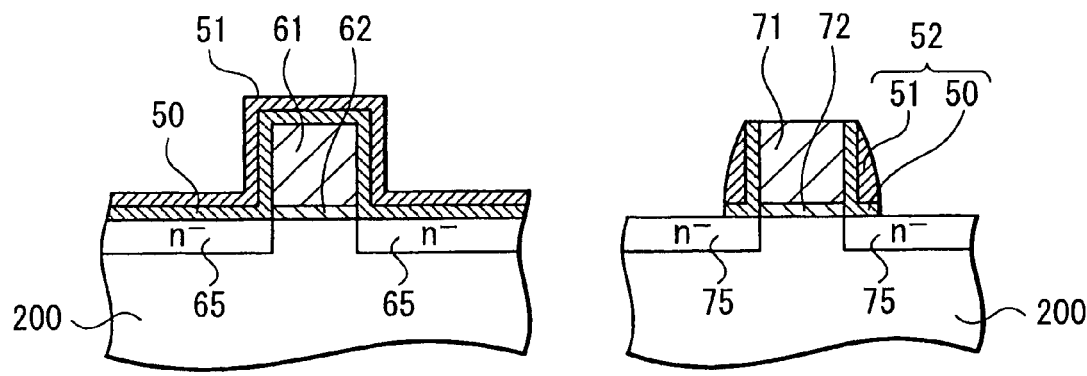
Figure 2D:
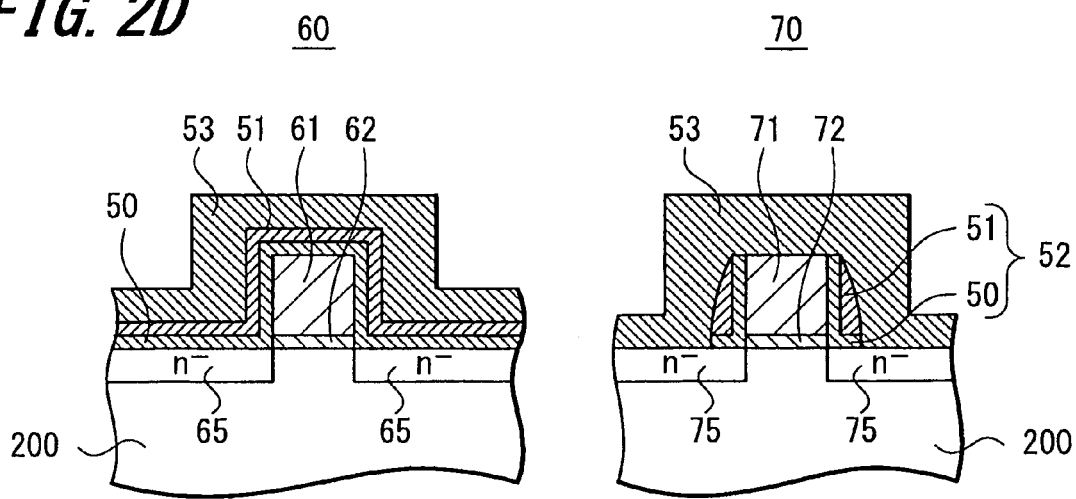
FIGS. 2D to 2F are views describing a method for producing a solid-state imaging element of the related art.
Figure 2E:
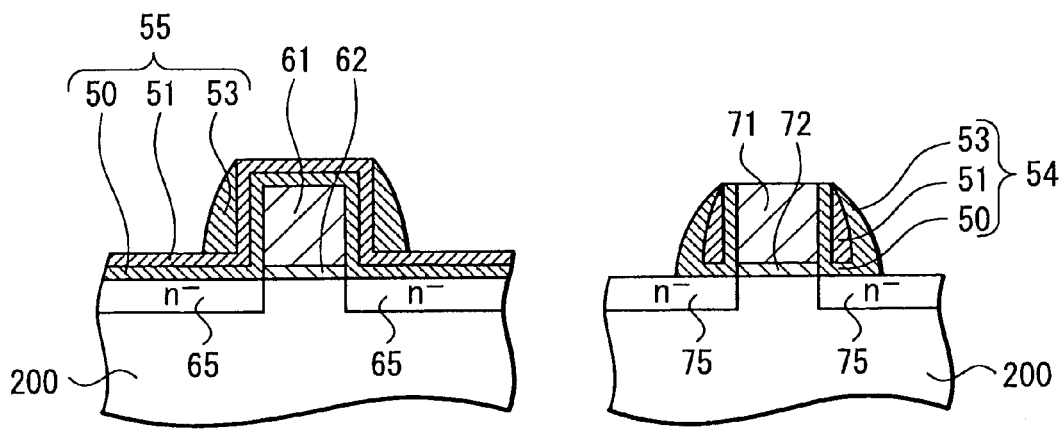
Figure 2F:
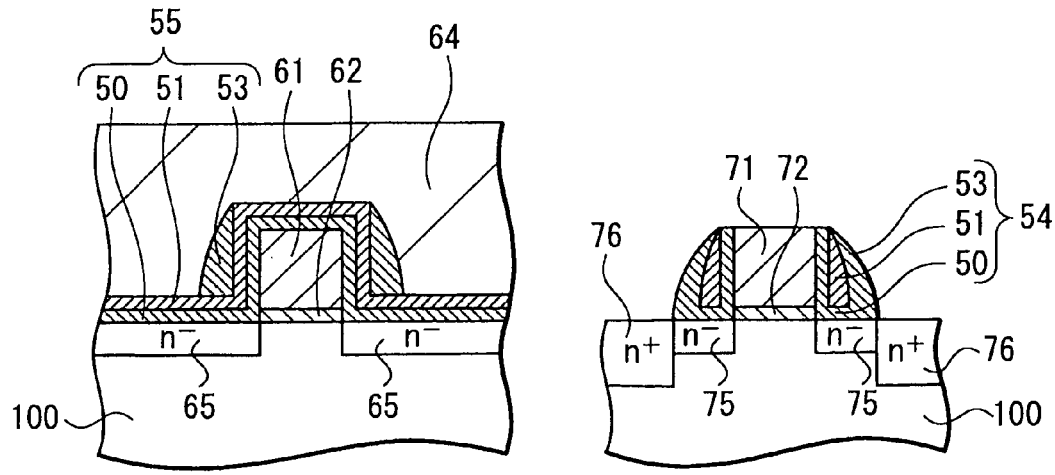
Figure 3G:
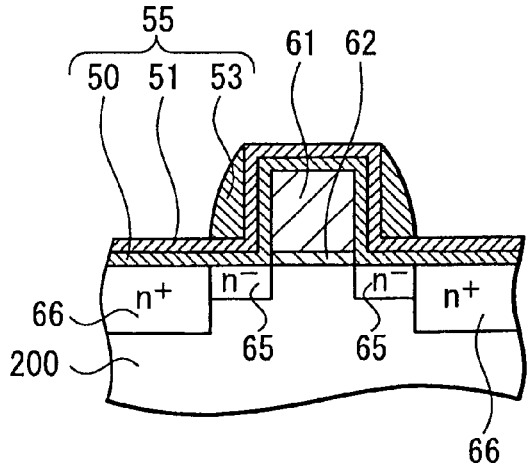
FIGS. 3G to 3I are views describing a method for producing a solid-state imaging element of the related art.
Figure 3G:
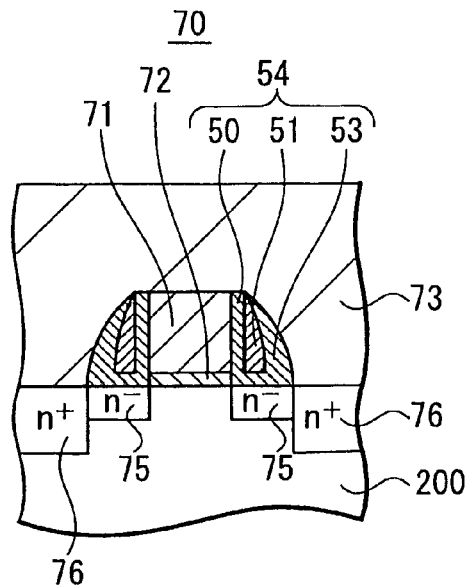
Figure 3H:
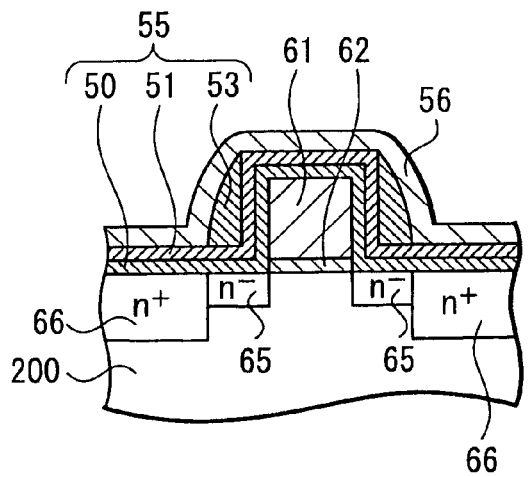
Figure 3H:
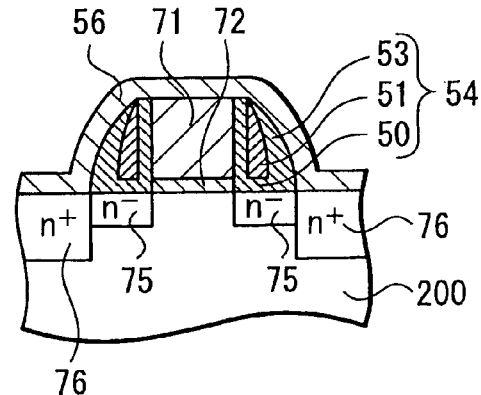
Figure 3I:
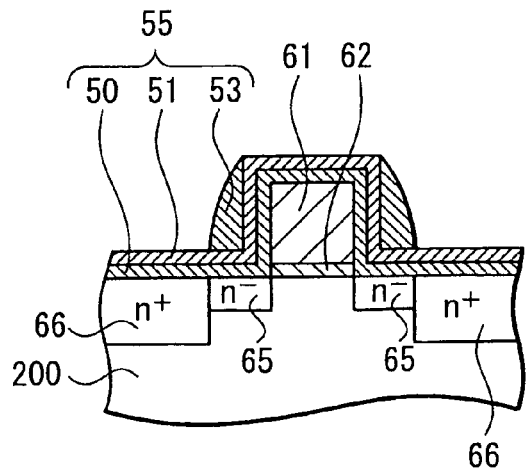
Figure 3I:
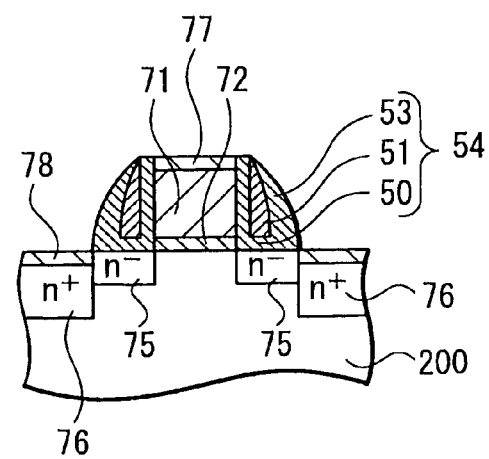
Figure 4:
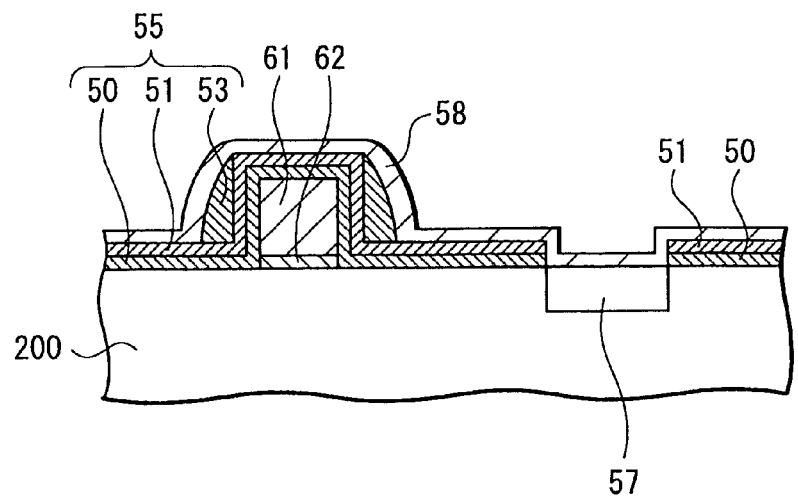
FIG. 4 is a view showing a hydrogen supply method of the related art.
Figure 5:
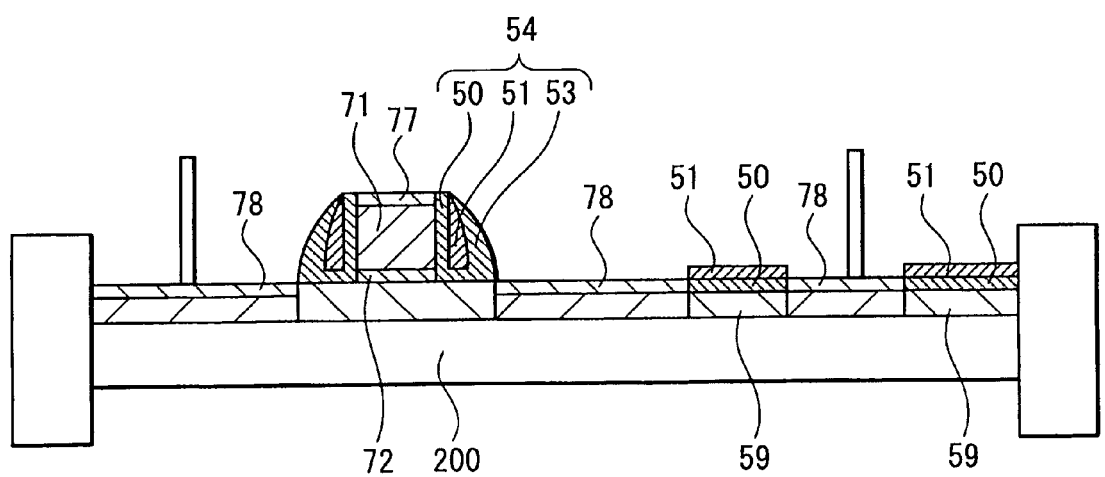
FIG. 5 is a view showing a diffused resistor in an I/O cell of the related art.

When a diffused resistor 59 (see FIG. 5) is prepared in an I/O cell to suppress the voltage applied to a transistor gate against electrostatic breakdown, impurity ions may be injected into the diffused resistor 59 in this step.

As shown in FIG. 8E, the HTO film 30 and the LP-SiN film 31 are entirely etched except for the sidewalls 32 and 33 formed on side surfaces of the gate electrodes 11 and 21.

Therefore, an I/O cell in the logic circuit region 20 does not have a salicide block film physically preventing ion injection into the diffused resistor 59.

Since the diffused resistor 59 does not have a salicide block film as described above, it is not necessary to inject ions into the diffused resistor 59 through a film. Accordingly, ions may be uniformly injected into the diffused resistor 59.

Figure 8F:
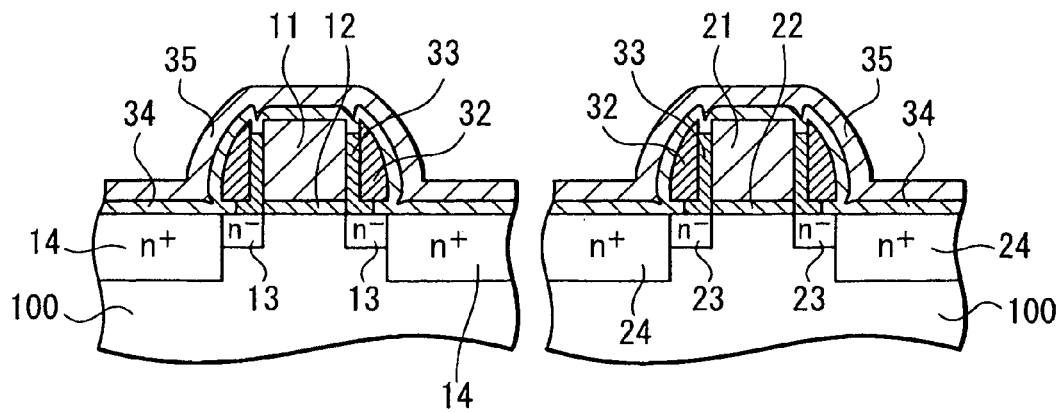

Next, as shown in FIG. 8F, a UV-SiN film 34 is deposited as a hydrogen supply film on a whole surface of each of the pixel region 10 and the logic circuit region 20. Next, a LP-SiN film 35 is deposited as a salicide block film on the UV-SiN film 34.

The UV-SiN film 34 functions as a hydrogen supply film to supply hydrogen to dangling bonds in a light receiving region 36 (see FIG. 6) formed in the semiconductor layer to generate charges by light irradiation. Therefore, when the UV-SiN film 34 is formed on the semiconductor layer 100, hydrogen may be supplied to the light receiving region from the UV-SiN film 34 to passivate the dangling bonds and reduce an effect of defects, such as white spots.

The LP-SiN film 35 formed on the UV-SiN film 34 functions as a salicide block film.

Since the LP-SiN film 35 is formed on the UV-SiN film 34, the salicide blocking ability and the process ability may be improved.

A silicon oxide film may also be used as a salicide block film, in addition to the LP-SiN film 35. However, since this salicide block film also is formed on the photodiode, the reflectivity is increased due to the relation in refractive index between the photodiode and the salicide block film when silicon oxide is used. Therefore, silicon nitride is preferably used as a salicide block film.

A film other than the UV-SiN film may be used as a hydrogen supply film insofar as the film may supply hydrogen.

Figure 9G:
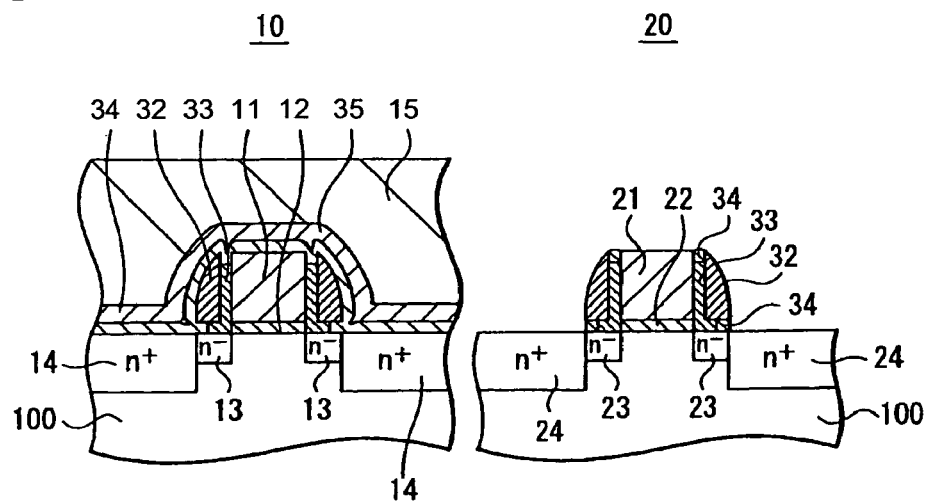
FIGS. 9G to 9I are views describing a method for producing a solid-state imaging element according to an embodiment of the invention.

Next, as shown in FIG. 9G, a non-silicided region, such as the pixel region 10, is covered with a photoresist 15, and then the UV-SiN film 34 and the LP-SiN film 35 in a silicided region, such as the logic circuit region 20, are etched.

Here, the UV-SiN film 34 remains in the offset part in the logic circuit region 20.

Figure 9H:
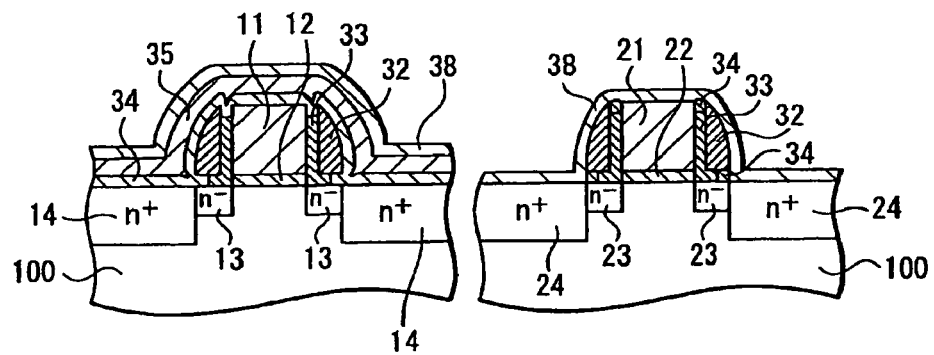

Next, the photoresist 15 in the pixel region 10 is removed, and then a high-melting metal film 38, such as a cobalt (Co) film, is deposited as shown in FIG. 9H.

Figure 9I:
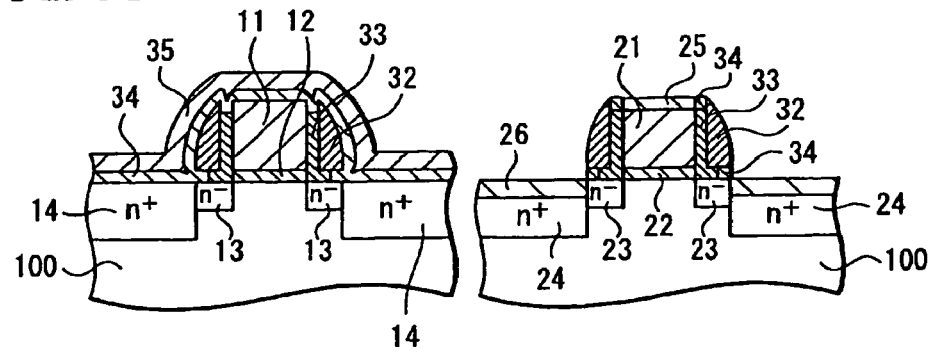

Next, silicon is reacted with the high-melting metal to form high-melting metal silicide layers 25 and 26 on a surface of the gate electrode 11 and surfaces of the n-type high impurity concentration regions 24 in the logic circuit region 20, respectively (see FIG. 9I).

Here, a whole surface of the non-silicided region, such as the pixel region 10, is covered with a salicide block film formed by the LP-SiN film 35. The LP-SiN film 35 is not etched back after deposition, for example, and therefore has no defects reducing ability of the LP-SiN film 35 as a salicide block film.

Therefore, the salicide block film formed by the LP-SiN film 35 may stably protect the non-silicided region in the aforementioned silicidation step.

Next, an excess of the high-melting metal film 38 is removed to form a non-silicided region having the non-silicided pixel region 10 and a silicided region having the silicided logic circuit region 20. A CMOS solid-state imaging element is formed in this manner.

In the solid-state imaging element, the logic circuit region may be formed to include a region having a surface without metal silicide formed, in addition to a silicided region formed by a gate electrode and a source/drain region having silicided surfaces.

In the aforementioned embodiment, the gate electrodes 11 and 21 are identical in shape and the sidewalls 32 and 33 are identical in shape in the pixel region 10 and the logic circuit region 20 to perform source/drain injection in one step. However, when the pixel region 10 and the logic circuit region 20 are provided with common device parameters, source/drain injection may be performed in separate steps for the pixel region 10 and the logic circuit region 20, respectively.

For example, the pixel region 10 is first covered with a photoresist, except for parts for forming source/drain regions. Then, source/drain injection is performed to form the n$^+$ regions 14 in the pixel region 10. Then, the photoresist covering the pixel region 10 except for the source/drain regions is removed to form the source/drain regions in the pixel region 10.

Next, the logic circuit region 20 is covered with a photoresist, except for parts for forming source/drain regions. Then, source/drain injection is performed to form the n$^+$ regions 24 in the logic circuit region 20. Then, the photoresist covering the logic circuit region 20 except for the source/drain regions is removed to form the source/drain regions in the logic circuit region 20.

In such steps, source/drain injection into the pixel region 10 and the logic circuit region 20 may be performed to form the n$^+$ regions 14 and 24.

In an embodiment of the invention, a semiconductor layer forming a light receiving part or a source/drain region of a transistor is not particularly limited, and various semiconductor layers are possible, such as a semiconductor substrate, a semiconductor epitaxial layer formed on a semiconductor substrate, and a thin-film semiconductor layer formed on an insulating substrate.

In an embodiment of the invention, a cross-sectional structure of a film such as a hydrogen supply film that is a UV-SiN film or a salicide block film that is an LP-SiN film, a sidewall, a gate electrode, or the like is not limited to that in the aforementioned embodiment; the cross-sectional structure may be designed in any size.

The invention is not limited to the above-described configuration, and various other configurations are possible without departing from the gist of the invention.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging element including a semiconductor layer having a light receiving part generating charges by light irradiation, the solid-state imaging element comprising:
    a non-silicided region including the light receiving part, in which surfaces of a source/drain region and a gate electrode of a non-silicided transistor are not silicided; and
    a silicided region in which the surfaces of a source/drain region and a gate electrode of a silicided transistor are silicided, wherein
    the non-silicided region having:
    a sidewall formed on a side surface of the gate electrode of the non-silicided transistor;
    a hydrogen supply film formed to cover the semiconductor layer, the gate electrode, and the sidewall of the non-silicided transistor; and
    a salicide block film formed on the hydrogen supply film to prevent silicidation of the non-silicided transistor, and
    the silicided region having:
    a sidewall formed on a side surface of the gate electrode of the silicided transistor without the salicide block film covering the semiconductor layer, the gate electrode, and the sidewall of the silicided transistor,
    wherein the sidewall in the silicided transistor has a structure identical to the sidewall in the non-silicided transistor,
    wherein the sidewall in the non-silicided transistor and silicided transistor is formed of a silicon oxide film and a silicon nitride film,
    wherein the silicon oxide film is an HTO (High Temperature Oxide) film and the silicon nitride film is an SiN film formed by low pressure CVD.

2. A solid-state imaging element according to claim 1, wherein said hydrogen supply film is a UV-SiN film.

3. A solid-state imaging element according to claim 1, wherein said salicide block film is a silicon oxide layer.

4. A solid-state imaging element according to claim 1, wherein said salicide block film is a silicon nitride layer.

5. A solid-state imaging element according to claim 4, wherein said silicon nitride layer is an LP-SiN layer.

* * * * *